United States Patent
Hsu et al.

(10) Patent No.: US 12,261,594 B2
(45) Date of Patent: Mar. 25, 2025

(54) CASCODE DIODE CIRCUIT

(71) Applicant: Fast SiC Semiconductor Incorporated, Hsinchu (TW)

(72) Inventors: Fu-Jen Hsu, Hsinchu (TW);
Cheng-Tyng Yen, Hsinchu (TW);
Hsiang-Ting Hung, Hsinchu (TW)

(73) Assignee: FAST SIC SEMICONDUCTOR INCORPORATED, Hsinchu (TW)

( * ) Notice: Subject to any disclaimer, the term of this patent is extended or adjusted under 35 U.S.C. 154(b) by 28 days.

(21) Appl. No.: 18/338,713

(22) Filed: Jun. 21, 2023

(65) Prior Publication Data
US 2024/0429912 A1  Dec. 26, 2024

(51) Int. Cl.
*H03K 17/10* (2006.01)
*H03K 17/0412* (2006.01)
*H03K 17/0812* (2006.01)
*H03K 17/12* (2006.01)
*H03K 17/74* (2006.01)

(52) U.S. Cl.
CPC ....... *H03K 17/10* (2013.01); *H03K 17/04123* (2013.01); *H03K 17/08122* (2013.01); *H03K 17/12* (2013.01); *H03K 17/74* (2013.01)

(58) Field of Classification Search
CPC ...... H03K 17/10; H03K 17/102; H03K 17/12; H03K 17/122; H03K 17/51; H03K 17/74
USPC ................................ 327/427, 430, 434, 581
See application file for complete search history.

(56) References Cited

U.S. PATENT DOCUMENTS

| | | | | |
|---|---|---|---|---|
| 2005/0225373 A1* | 10/2005 | Morita | ............... | H03K 17/6871 327/377 |
| 2012/0262220 A1* | 10/2012 | Springett | ............. | H03K 17/567 327/434 |
| 2014/0346570 A1* | 11/2014 | Ueno | ................... | H01L 27/0605 257/195 |
| 2015/0042177 A1* | 2/2015 | Weyers | ............... | H01L 29/7809 307/115 |
| 2015/0043116 A1* | 2/2015 | Weyers | ................... | H03K 17/74 257/272 |

OTHER PUBLICATIONS

Y. Li and A. Q. Huang, "Huang-Pair: A New High Voltage Diode Concept and Its Demonstration," in IEEE Transactions on Power Electronics, vol. 36, No. 8, pp. 8653-8657, Aug. 2021.

* cited by examiner

*Primary Examiner* — William Hernandez
(74) *Attorney, Agent, or Firm* — Muncy, Geissler, Olds & Lowe, P.C.

(57) ABSTRACT

Embodiments relate to a cascode diode circuit. The cascode diode circuit comprises a normally on transistor, a low voltage diode and a high voltage diode. The normally on transistor has a gate, a drain, and a source. The low voltage diode has a cathode connected to the source of the normally on transistor and an anode connected to the gate of the normally on transistor. The high voltage diode has a cathode connected to a node between the normally on transistor and the low voltage diode, and an anode connected the drain of the normally on transistor.

9 Claims, 5 Drawing Sheets

CASCODE DIODE CIRCUIT

FIELD OF THE INVENTION

The present disclosure relates to a diode circuit and more particularly to a cascode diode circuit with ultralow forward voltage drop.

BACKGROUND OF THE INVENTION

For high power and/or high performance circuit applications, transistors such as gallium nitride/silicon carbide field effect transistors are desirable for their high efficiency and high voltage operation. A popular design combines such III-nitride transistors with silicon diodes, to assemble a cascode diode circuit, which may be found in Yuan Li and Alex Q. Huang, "Huang-Pair: A New High Voltage Diode Concept and Its Demonstration" in IEEE Transactions on Power Electronics, vol. 36, no. 8, pp. 8653-8657, August 2021.

The circuit in the reference used a pair of SiC transistor and Si diode. The high voltage transistor is required to achieve the I-V behavior as disclosed in the reference. However, the high voltage SiC transistor is quite expensive and will cause cost of the circuits to rise, which make them challenging to use in commercial applications.

Hence, a simple and cost-effective circuit design is needed to satisfy the balance between performance and cost.

SUMMARY OF THE INVENTION

In accordance with an aspect of the present disclosure, a cascode diode circuit is disclosed. The cascode diode circuit comprises a normally on transistor, a low voltage diode and a high voltage diode. The normally on transistor has a gate, a drain, and a source. The low voltage diode has a cathode connected to the source of the normally on transistor and an anode connected to the gate of the normally on transistor. The high voltage diode has a cathode connected to a node between the normally on transistor and the low voltage diode, and an anode connected the drain of the normally on transistor. Either a current rating or a voltage rating of the normally on transistor is equal to or smaller than which of the high voltage diode.

DETAILED DESCRIPTION OF THE PREFERRED EMBODIMENTS

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
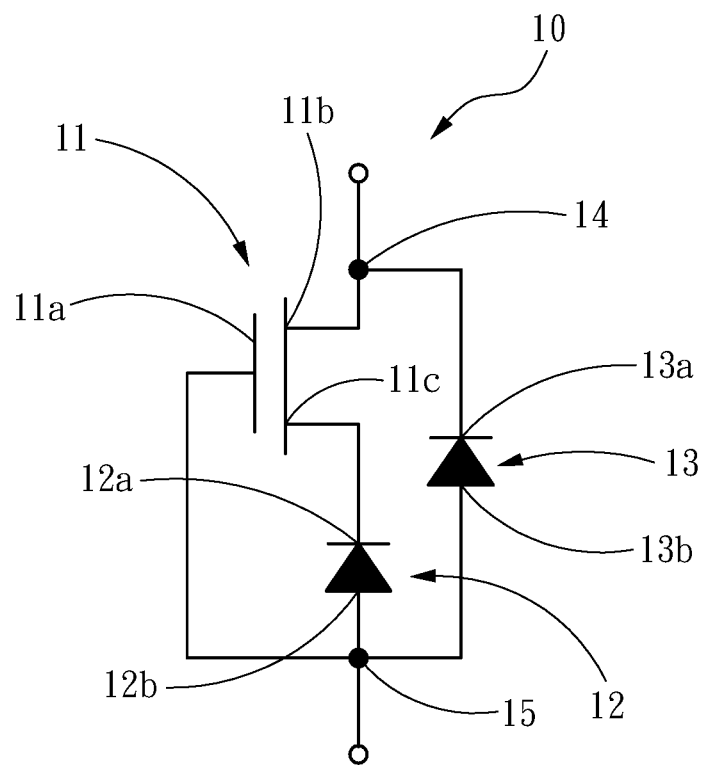
FIG. 1 illustrates the cascode diode circuit according to an embodiment of the present disclosure.

FIG. 1 shows the cascode diode circuit according to an embodiment of the present disclosure. The cascode diode circuit 10 includes a normally on transistor 11, a low voltage diode 12 and a high voltage diode 13.

In an exemplary embodiment, the normally on transistor 11 may be a normally on high voltage WBG transistor, which can be implemented by using a MOSFET. For example, the transistor 11 may be a SiC transistor, a GaN transistor, a AlN transistor, a diamond transistor or any other transistor with 2.5 eV bandgaps. The low voltage diode 12 is with low knee voltage (low barrier height). The high voltage diode 13 is a high voltage and high current diode, such as a high voltage power WBG diode. In an example, the normally on transistor 11 may have a current rating and/or a voltage rating equal to or smaller than the high voltage diode 13.

The configuration of the transistor and the diodes will now be described in terms of the connections of each terminal shown in FIG. 1. The normally on transistor 11 has a gate 11a, a drain 11b, and a source 11c. The low voltage diode 12 has a cathode 12a and an anode 12b. The high voltage diode 13 also has a cathode 13a and an anode 13b. The cathode 12a of the low voltage diode 12 is connected to the source 11c of the normally on transistor 11 and the anode 12b of the low voltage diode 12 is connected to the gate 11a of the normally on transistor 11. The cathode 13a of the high voltage diode 13 is connected to a node 14 between the normally on transistor 11 and the low voltage diode 12 and the anode 13b of the high voltage diode 13 is connected to a node 15 between the anode 12b of the low voltage diode 12 and the gate 11a of the normally on transistor 11.

In an exemplary embodiment, a voltage rating of the normally on transistor 11, the low voltage diode 12 and the high voltage diode 13 may satisfy the following relationship:

$$V_L \leq V_{TR} \leq V_H$$

where $V_{TR}$ denotes the voltage rating of the normally on transistor 11, $V_L$ denotes the voltage rating of the low voltage diode 12, and $V_H$ denotes the voltage rating of the high voltage diode 13. In a non-limiting example, the voltage rating of the normally on transistor 11 may be equal to or greater than 200V, the voltage rating of the high voltage diode 13 is equal to or greater than 200V, and the voltage rating of the low voltage diode 12 is equal to or smaller than 200V.

In an exemplary embodiment, a current rating of the normally on transistor 11, the low voltage diode 12 and the high voltage diode 13 may satisfy the following relationship:

$$I_{TR} \leq I_H$$

$$I_L \leq I_H$$

where $I_{TR}$ denotes the current rating of the normally on transistor 11, $I_L$ denotes the current rating of the low voltage diode 12, and $I_H$ denotes the current rating of the high voltage diode 13. $I_{TR}$ may be equal to, greater than or smaller than $I_L$. In a non-limiting example, the current rating of the normally on transistor 11 may be equal to or greater than 1 mA, the current rating of the low voltage diode 12 may be equal to or greater than 1 mA and the current rating of the high voltage diode 13 may be equal to or greater than 10 mA.

Figure 2:
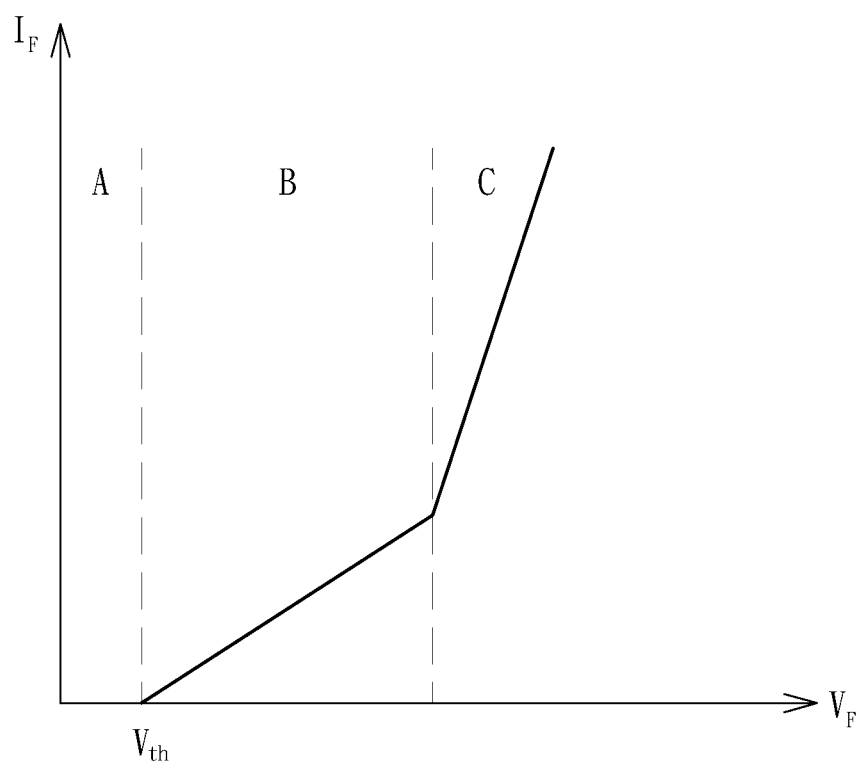
FIG. 2 illustrates forward characteristic curve according to an embodiment of the present disclosure.

FIG. 2 illustrates the I-V curve characteristics of the embodiment of FIG. 1. As expected, the current remains zero in region A until the threshold voltage ($V_{th}$), the threshold voltage of the cascode diode circuit 10 according to the embodiment is reached at about 0.3 V, which is attributed to the combination of the normally on transistor 11 and the low voltage diode 12. Above the threshold voltage, the current rises at a first rate in region B until the normally on transistor 11 is fully turned on. In region C, the slope of the I-V curve is at a second rate. In region B, the current flows through the low voltage diode 12; while in region C, the current flows through the high voltage diode 13.

The cascode diode circuit 10 could exhibit excellent characteristic of ultralow forward voltage ($V_f$) due to the combination of the normally on transistor 11 and the low voltage diode 12. Hence, when operating at a lower current level, the cascode diode circuit 10 is able to provide enough blocking voltage. While when operating at a high current level, the high voltage diode 13 could provide enough current. As a result, the cascode connection of the normally on transistor 11, the low voltage diode 12 and the high voltage diode 13 provides a low-cost alternative to the conventional diode circuit, while retaining excellent characteristics in both current and blocking level.

In an exemplary embodiment, a breakdown voltage of the normally on transistor 11 is equal to or greater than a breakdown voltage of the high voltage diode 13. In another exemplary embodiment, a breakdown voltage of the high voltage diode 13 is greater than a breakdown voltage of the low voltage diode 12.

In yet another exemplary embodiment, an absolute value of a breakdown voltage of the low voltage diode 12 is equal to or greater than a gate threshold voltage of the normally on transistor 11.

Figure 3A:
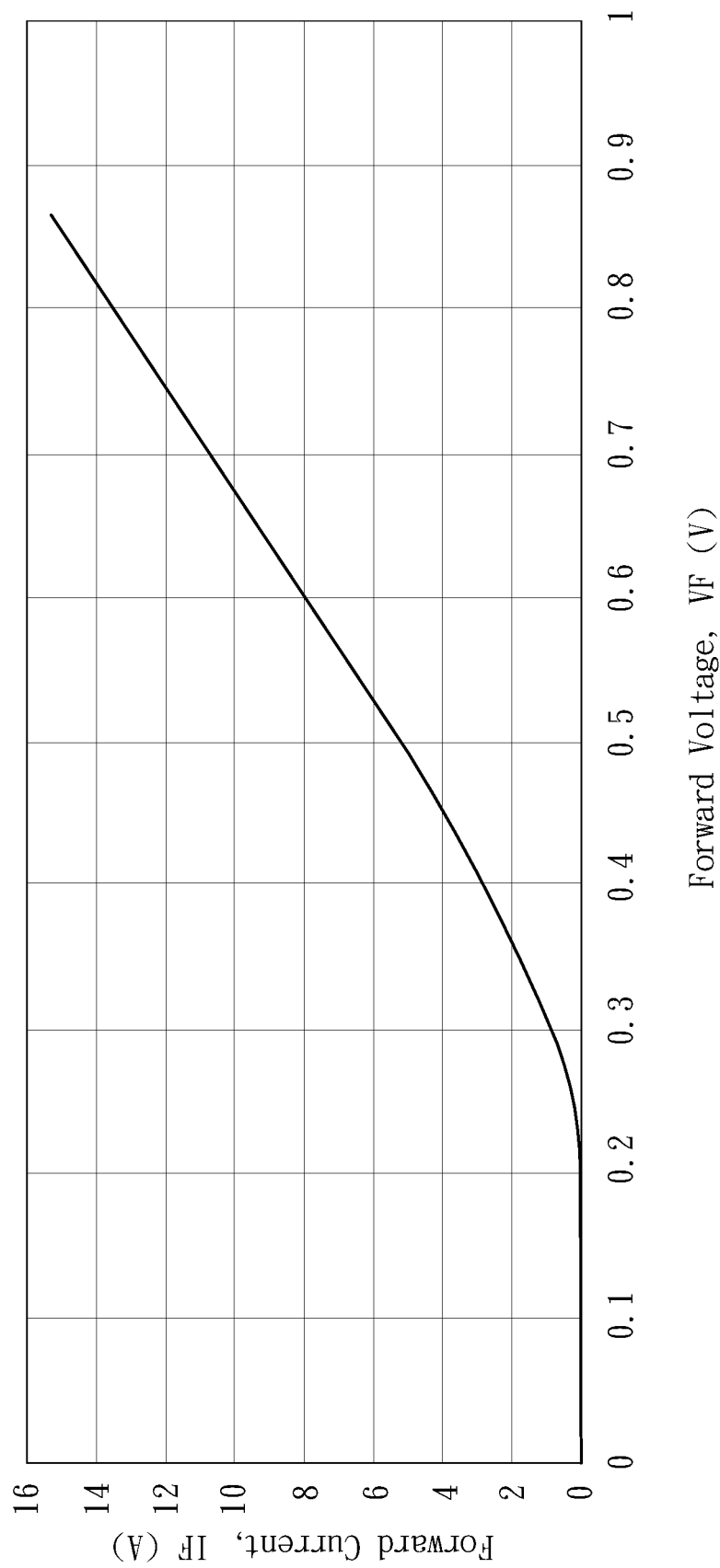
FIGS. 3A and 3B are graphs of forward characteristic curves with different scales measured from the cascode diode circuit according to an example embodiment.
Figure 3B:
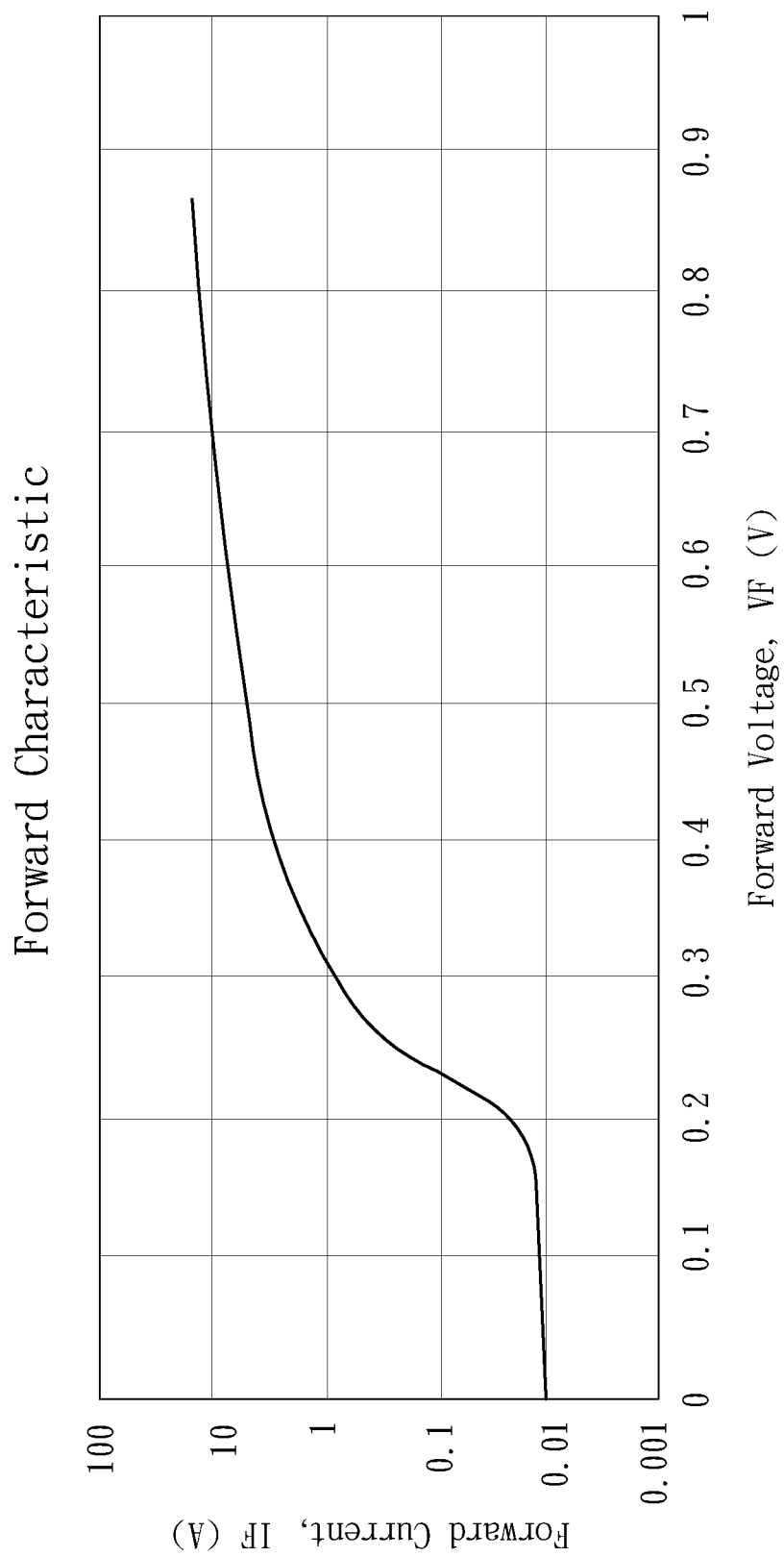
Figure 4:
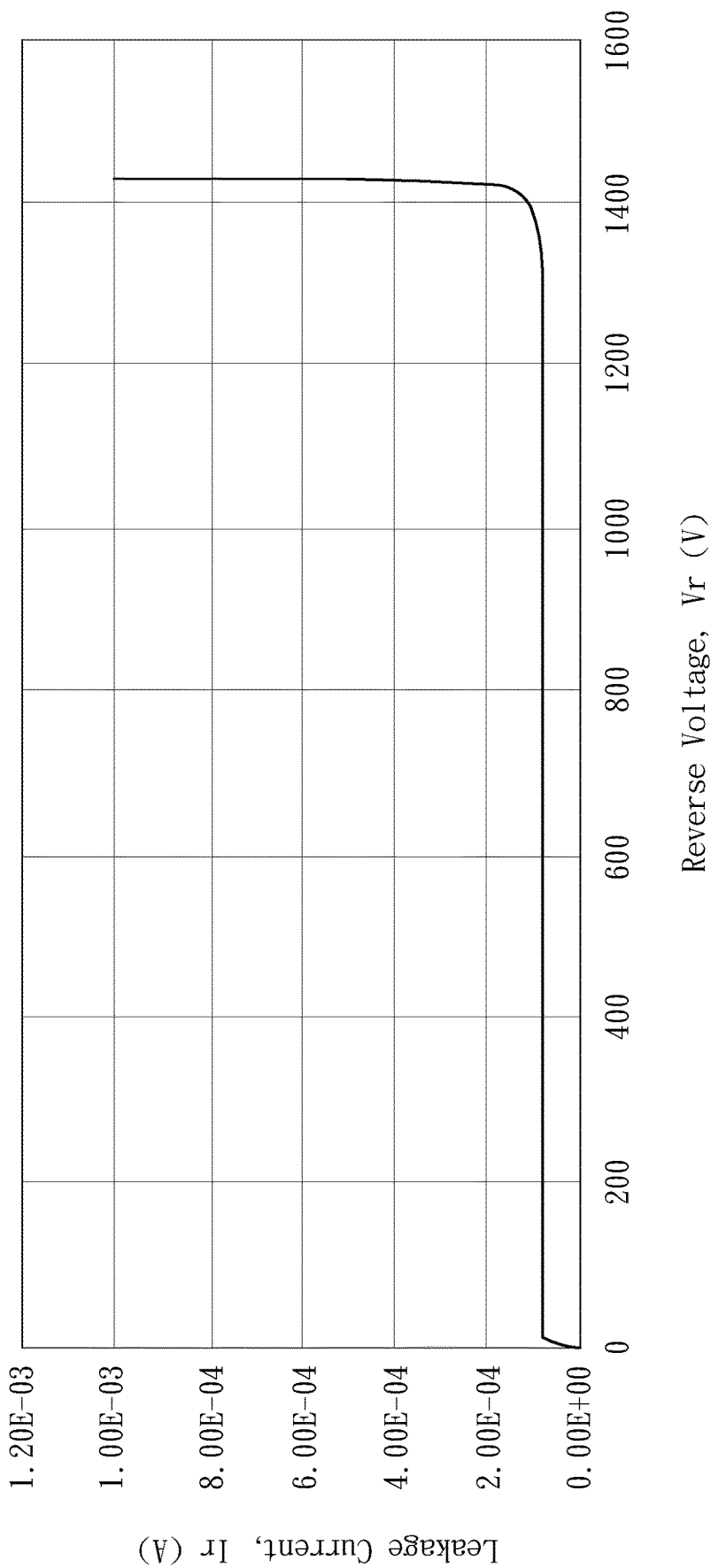
FIG. 4 is graph of reverse characteristic curve measured from the cascode diode circuit according to the example embodiment.

FIGS. 3A, 3B and 4 show measurement results of I-V forward and reverse characteristics of the cascode diode circuit according to an example embodiment. As shown in the measurement results, the cascode diode circuit according to the example embodiment is capable of exhibiting ultralow forward voltage and fast switching speed, while the combination of the transistor with the low voltage diode provides a simple and low-cost solution.

By using the combination of the normally on transistor with low current/voltage rating and two diodes instead of high voltage transistor, a high cost-performance solution of cascode diode circuit with low voltage drop is provided.

What is claimed is:

1. A cascode diode circuit, comprising:
    a normally on transistor, having a gate, a drain, and a source;
    a low voltage diode, having a cathode connected to the source of the normally on transistor, and an anode connected to the gate of the normally on transistor; and
    a high voltage diode, having an anode connected to a node between the normally on transistor and the low voltage diode, and a cathode connected to the drain of the normally on transistor;
    wherein either a current rating or a voltage rating of the normally on transistor is equal to or smaller than which of the high voltage diode; and
    wherein the current rating of the low voltage diode is equal to or smaller than that of the high voltage diode.

2. The cascode diode circuit of claim 1, wherein a breakdown voltage of the normally on transistor is equal to or greater than a breakdown voltage of the high voltage diode.

3. The cascode diode circuit of claim 1, wherein a breakdown voltage of the high voltage diode is greater than a breakdown voltage of the low voltage diode.

4. The cascode diode circuit of claim 1, wherein an absolute value of a breakdown voltage of the low voltage diode is equal to or greater than a gate threshold voltage of the normally on transistor.

5. The cascode diode circuit of claim 1, wherein the normally on transistor, the low voltage diode and the high voltage diode satisfy the following relationship:

$$V_L \leq V_{TR} \leq V_H$$

wherein $V_{TR}$ denotes the voltage rating of the normally on transistor, $V_L$ denotes the voltage rating of the low voltage diode, and $V_H$ denotes the voltage rating of the high voltage diode.

6. The cascode diode circuit of claim 1, wherein the voltage rating of the normally on transistor is equal to or greater than a predetermined value, the voltage rating of the high voltage diode is equal to or greater than the predetermined value, and the voltage rating of the low voltage diode is equal to or smaller than the predetermined value.

7. The cascode diode circuit of claim 1, wherein the current rating of the normally on transistor is equal to or greater than a first predetermined value, the current rating of the low voltage diode is equal to or greater than the first predetermined value and the current rating of the high voltage diode is equal to or greater than a second predetermined value, wherein the second predetermined value is greater than the first predetermined value.

8. The cascode diode circuit of claim 1, wherein both the current rating and the voltage rating of the normally on transistor is equal to or smaller than that of the high voltage diode.

9. The cascode diode circuit of claim 1, wherein the normally on transistor is a MOSFET, a JFET or an HEMT.

* * * * *